US009551419B2

(12) United States Patent
Kantola et al.

(10) Patent No.: US 9,551,419 B2
(45) Date of Patent: Jan. 24, 2017

(54) COATED SLIDING ELEMENT (71) Applicant: FEDERAL-MOGUL CORPORATION, Southfield, MI (US)

(72) Inventors: Troy Kantola, Whitmore Lake, MI (US); James R. Toth, Ann Arbor, MI (US); Robert R. Aharonov, West Bloomfield, MI (US)

(73) Assignee: Federal-Mogul Corporation, Southfield, MI (US)

( * ) Notice: Subject to any disclaimer, the term of this patent is extended or adjusted under 35 U.S.C. 154(b) by 0 days.

(21) Appl. No.: 14/693,194

(22) Filed: Apr. 22, 2015

(65) Prior Publication Data

US 2016/0312891 A1 Oct. 27, 2016

(51) Int. Cl.
*F16J 9/26* (2006.01)
*F16J 9/28* (2006.01)
*C23C 16/56* (2006.01)
*C23C 16/32* (2006.01)
*C23C 16/34* (2006.01)
*C23C 16/27* (2006.01)
*C23C 16/06* (2006.01)
(Continued)

(52) U.S. Cl.
CPC .................. *F16J 9/26* (2013.01); *C23C 16/06* (2013.01); *C23C 16/276* (2013.01); *C23C 16/32* (2013.01); *C23C 16/34* (2013.01); *C23C 16/56* (2013.01); *C25D 3/04* (2013.01); *C25D 7/00* (2013.01); *C25D 9/04* (2013.01); *F16J 9/28* (2013.01)

(58) Field of Classification Search
CPC ...................... F16J 9/00; F16J 9/26; F16J 9/28
See application file for complete search history.

(56) References Cited

U.S. PATENT DOCUMENTS 3,806,139 A 4/1974 Suzuki et al.
4,899,702 A 2/1990 Sasaki et al.
(Continued)

FOREIGN PATENT DOCUMENTS

DE 19614105 A1 10/1997
DE 102010062114 A1 5/2012
(Continued)

OTHER PUBLICATIONS

International Search Report, mailed Jul. 7, 2016 (PCT/US2016/028227).

*Primary Examiner* — Gilbert Lee
(74) *Attorney, Agent, or Firm* — Robert L. Stearns; Dickinson Wright, PLLC (57) ABSTRACT

A sliding element, such as a piston ring, including a substrate, base coating, and relatively thin sliding coating is provided. The base coating is typically applied to a running surface of the substrate by PVD, CVD, galvanic deposition, electrodeposition, or a thermal spray process. The sliding coating includes a polymer matrix and hard particles disposed throughout the matrix. The sliding coating is applied to the base coating when the base coating is still in its as-applied condition and has a surface roughness of at least 4.0 μm. During use of the sliding element, the thin sliding coating acts as a sacrificial run-in layer. In addition, as the polymer matrix of the sliding coating wears away, the hard particles polish the rough surface of the base coating. Thus, polishing or lapping of the as-applied base coating prior to use of the sliding element is not required.

17 Claims, 5 Drawing Sheets

(51) Int. Cl.
  *C25D 3/04* (2006.01)
  *C25D 7/00* (2006.01)
  *C25D 9/04* (2006.01)

(56) References Cited

U.S. PATENT DOCUMENTS

| | | |
|---|---|---|
| 5,392,692 A | 2/1995 | Rao et al. |
| 5,430,938 A | 7/1995 | Rao et al. |
| 5,490,445 A | 2/1996 | Rao et al. |
| 5,531,195 A | 7/1996 | Onoda et al. |
| 5,598,763 A | 2/1997 | Rao et al. |
| 8,088,496 B2 | 1/2012 | Kariya et al. |
| 8,240,676 B2 | 8/2012 | Kariya et al. |
| 2005/0069724 A1* | 3/2005 | Obara ............... C23C 4/02 428/544 |
| 2010/0140880 A1 | 6/2010 | Hayashi et al. |
| 2011/0254230 A1* | 10/2011 | Jarosinski ............... C22C 27/06 277/444 |
| 2011/0268944 A1 | 11/2011 | Adam et al. |
| 2012/0242047 A1 | 9/2012 | Sasaki et al. |
| 2012/0248711 A1* | 10/2012 | Iwashita ............. C23C 14/0605 277/444 |
| 2013/0316156 A1 | 11/2013 | Kennedy et al. |
| 2014/0225329 A1 | 8/2014 | Hayashi et al. |
| 2015/0240347 A1 | 8/2015 | Lehnert et al. |

FOREIGN PATENT DOCUMENTS

| | | |
|---|---|---|
| DE | 102012020756 A1 | 4/2014 |
| EP | 0984182 A1 | 2/1999 |
| EP | 1775487 A2 | 4/2007 |
| JP | 58023256 | 2/1983 |
| JP | 62233458 | 10/1987 |
| JP | 01206162 | 8/1989 |
| WO | 2012067735 A1 | 5/2012 |
| WO | 2013063342 A1 | 5/2013 |

* cited by examiner

COATED SLIDING ELEMENT

BACKGROUND OF THE INVENTION

1. Field of the Invention

The invention relates to a coated sliding element, such as a piston ring, and methods of manufacturing the coated sliding element.

2. Related Art

Sliding elements of engine applications typically consist of multiple-layer materials with modified surfaces to optimize the sliding characteristics. For example, the sliding elements can include metal layers, possibly based on lead, tin or aluminum, which are applied by a galvanic process, vaporization, or ion plating. Non-metal sliding layers are also known, such as those having an artificial resin base modified to achieve certain properties, load capacity, and resistance to wear.

Although the load capacity provided by the known coatings is high, failure of the sliding function can result if the load capacity limit is exceeded. The associated exposure of the substrate material can then cause seizure leading to total failure of the sliding element.

Resin-based sliding coatings have also been used for many years to reduce friction in mechanical constructions. Usually, metal, plastic and rubber components are coated, which need to be easily movable without further lubrication. In typical applications, the loads are rather low and the boundary conditions, such as temperature and media, are non-critical. It is known from various publications, in particular from EP 0 984 182 A1, that engine applications, for example crank shaft bearings, are also possible with such sliding elements. In this document, an overlay with a matrix of polyimide (PI), polyamideimide (PAI), epoxy resin or a phenolic resin is described, to which $Fe_3O_4$ can be added, amongst others, to reduce wear.

DE 196 14 105 A1 reveals a wear and cavitation-resistant plastics sliding layer consisting of a matrix material made of polytetrafluoroethylene (PTFE) or thermoplastic fluoropolymers, $Fe_2O_3$, and solid lubricants. This material is used for bearings, for example as a guide element for shock absorbers, and is only suitable for low sliding speeds and low loads due to its structure and the soft fluoropolymer matrix.

EP 1 775 487 A2 discloses a sliding bearing which has a metal carrier material, and an aluminum alloy and plastic sliding layer applied to the metal carrier material. In order to improve the bonding strength and cavitation resistance of the plastic sliding layer, a material is suggested that has a bonding agent made of PI, PAI, polyben-zimidazole (PBI), engineered (EP), and functional polymer (FP), as well as a solid lubricant such as $MoS_2$, graphite, PTFE, and BN.

SUMMARY OF THE INVENTION

The invention provides a sliding element having a high peak load capacity with improved wear resistance. The sliding element can be used at high temperatures and sliding speeds, for example on moving components within internal combustion engines. The sliding element includes a substrate, a base coating applied to the substrate, and a sliding coating applied to the base coating. The base coating has a thickness and a surface roughness (Rz) of at least 4.0 μm. The sliding coating includes a matrix formed of least one of a polymer. The sliding coating also includes hard particles disposed in the matrix, and the hard particles are formed of at least one of nitrides, carbides, borides, oxides, and metal. The sliding coating has a thickness of 2% to 60% of the thickness of the base coating.

Another aspect of the invention provides a method of manufacturing the sliding element. The method includes applying the base coating to the substrate; and applying the sliding coating to the base coating.

During use of the sliding element, the sliding coating acts as a sacrificial run-in layer as it slides along another component. In addition, as the polymer matrix of the sliding coating wears away, the hard particles polish or reduce the surface roughness of the base coating. Thus, polishing or lapping of the as-applied base coating prior to use of the sliding element is no longer required.

BRIEF DESCRIPTION OF THE DRAWINGS

Other advantages of the present invention will be readily appreciated, as the same becomes better understood by reference to the following detailed description when considered in connection with the accompanying drawings wherein:

FIGS. 3A-4B are optical microscope images of a coated piston ring according to an example embodiment;

DESCRIPTION OF THE ENABLING EMBODIMENT

Figure 1:
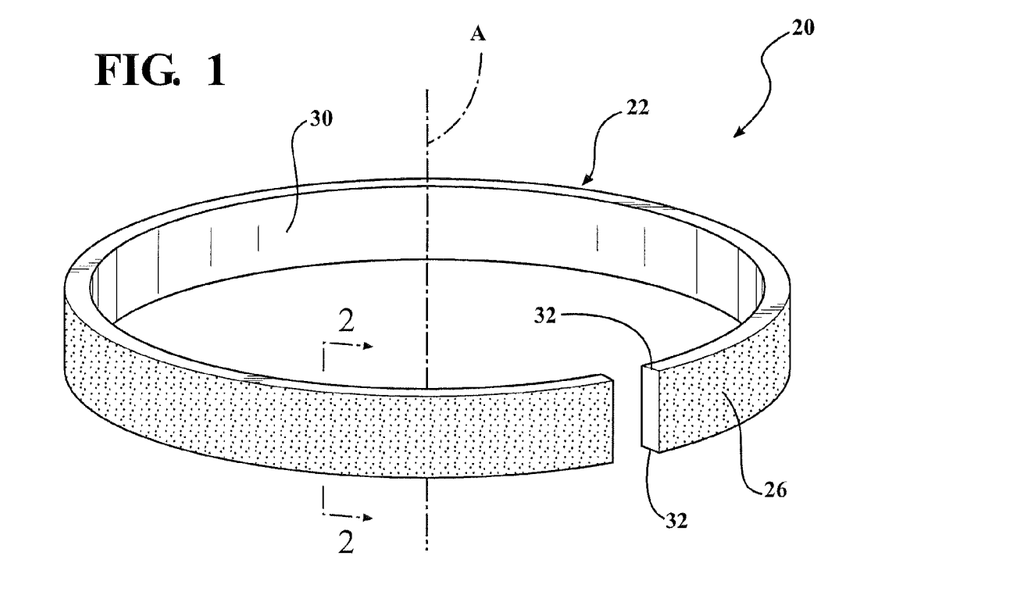
FIG. 1 is perspective view of a coated piston ring according to one example embodiment.
Figure 2:
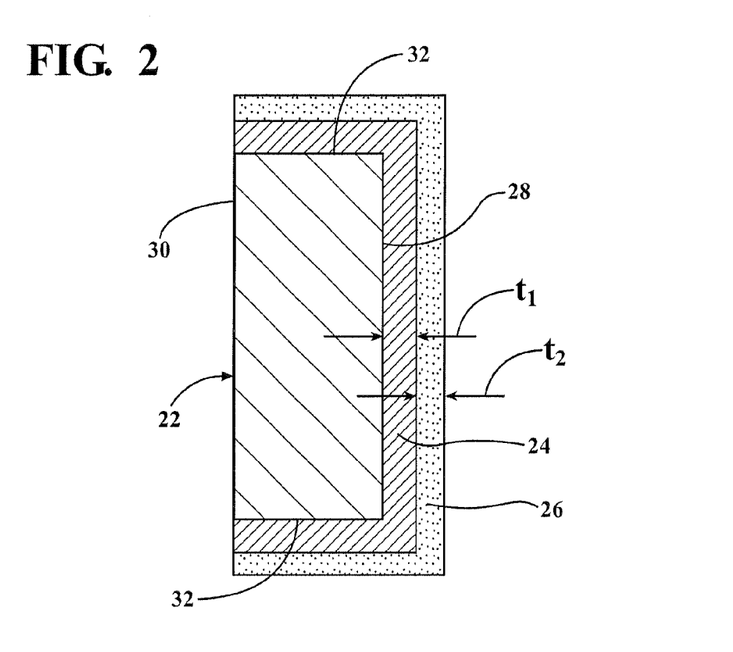
FIG. 2 is a cross-sectional view of the coated piston ring of FIG. 1 along line 2-2.

One aspect of the invention provides a sliding element 20 including a substrate 22, a base coating 24, and a sliding coating 26 applied thereto. The sliding element 20 is typically used in internal combustion engine applications, and preferably fluid-lubricated applications which are under a high peak load. For example, the sliding element 20 can be used as a bearing for a crank shaft, a piston skirt, or a piston ring. FIGS. 1 and 2 illustrate an exemplary embodiment wherein the sliding element 20 comprises a piston ring.

The substrate 22 of the sliding element 20 is typically formed of metal, but may be formed of a non-metal. In the exemplary embodiment, the substrate 22 is formed of an iron-based material, such as cast iron or steel. The substrate 22 also presents at least one running surface 28 to which the base coating 24 and sliding coating 26 are applied. In the exemplary embodiment of FIGS. 1 and 2, the substrate 22 is a piston ring presenting an inside surface 30 facing toward and extending circumferentially around a center axis A, the running surface 28 faces opposite the inside surface 30, and a pair of side surfaces 32 interconnect the inside surface 30 and the running surface 28. The side surfaces 32 can extend parallel to one another, as shown in FIGS. 1 and 2. Alternatively, the side surface 32 can be disposed at an angle to provide a Keystone configuration (not shown). In addition, the running surface 28 and inside surface 30 can be parallel to one another, as shown in FIGS. 1 and 2. Alternatively, the running surface 28 and/or inside surface 30 can be angled, convex, or concave.

The base coating 24 is applied to at least the running surface 28 of the substrate 22, but may be applied to one or more of the other surfaces. In the exemplary embodiment, the base coating 24 is applied to both the running surface 28 and the side surfaces 32 of the substrate 22.

The base coating 24 is formed of a material capable of protecting the substrate 22 from scuffing and wear during use of the sliding element 20. The composition of the base coating 24 can include a metal or non-metal, such as a ceramic, or mixture of metal and non-metal. For example, the composition of the base coating 24 can be selected from one or more of: chromium (Cr), chromium nitride (CrN), chromium carbide (CrC), chromium oxy nitride (CrON), titanium nitride (TiN), zirconium nitride (ZrN), aluminum titanium nitride (AlTiN), chromium and aluminum oxide, chromium and a ceramic, chromium and diamond, diamond, diamond like carbon (DLC), and multi-layers thereof.

Various different processes can be used to apply the base coating 24 to the substrate 22. For example, the base coating 24 can be applied by a process selected from the group consisting of: physical vapor deposition (PVD), chemical vapor deposition (CVD), galvanic deposition, electrodeposition, electrochemical deposition, and thermal processes, such as thermal spraying. Example physical vapor deposition processes include plasma-assisted physical vapor deposition (PA-PVD), cathodic arc deposition, sputtering, and electron beam evaporation. The chemical vapor deposition process can include plasma-assisted chemical vapor deposition (PA-CVD).

In one exemplary embodiment, the base coating 24 consists of chromium and is applied by galvanic deposition. In another embodiment, the base coating 24 consists of chromium and aluminum oxide, for example a material referred to as Chrome Ceramic Coating (CKS®), and is applied by galvanic deposition or electrochemical deposition. In yet another embodiment, the base coating 24 consists of chromium and diamond particles embedded in a fine crack network, for example a material referred to as GOETZE Diamond Coating (GDC®), and is applied by galvanic deposition or electrochemical deposition. In another embodiment, the base coating 24 consists entirely of chromium and is applied by galvanic deposition. In yet another embodiment, the base coating 24 consists of chromium and nitrogen and is applied by physical vapor deposition. In another embodiment, the base coating 24 consists of diamond or diamond like carbon (DLC) and is applied by physical vapor deposition, chemical vapor deposition, or plasma-assisted chemical vapor deposition (PA-CVD).

The process used to apply the base coating 24 to the substrate 22 leaves the base coating 24 with a surface roughness ($R_z$) of at least 4.0 μm in its as-applied condition. In the exemplary embodiment, the base coating 24 has a surface roughness ($R_z$) of 5.0 μm to 8.0 μm and a surface roughness ($R_a$) of 0.6 μm to 0.8 μm. Typically, the base coating 24 is also applied to a thickness $t_1$ of not greater than 50 μm. However, for galvanic coatings, the thickness could be up to 300 μm. The base coating 24 is not polished, lapped, or subjected any other process wherein the surface roughness is reduced prior to apply the sliding coating 26. The base coating 24 remains in its as-applied when the sliding coating 26 is applied.

The sliding coating 26 is disposed directly on the base coating 24 when the base coating 24 is still in its as-applied condition and thus has a surface roughness ($R_z$) of at least 4.0 μm. The sliding coating 26 can be applied by various different methods. For example, the sliding coating 26 can be applied by a chemical or physical process, as a liquid or powder material, and can be formed into a continuous thin film. In one embodiment, the process of applying the sliding coating 26 to the base coating 24 includes evaporation of a solvent or hardening by UV radiation. In the exemplary embodiment, wherein the substrate 22 is a piston ring, the sliding coating 26 is preferably applied to a thickness $t_2$ of not greater than 50 μm, are more typically less than 20 μm.

Figure 3A:
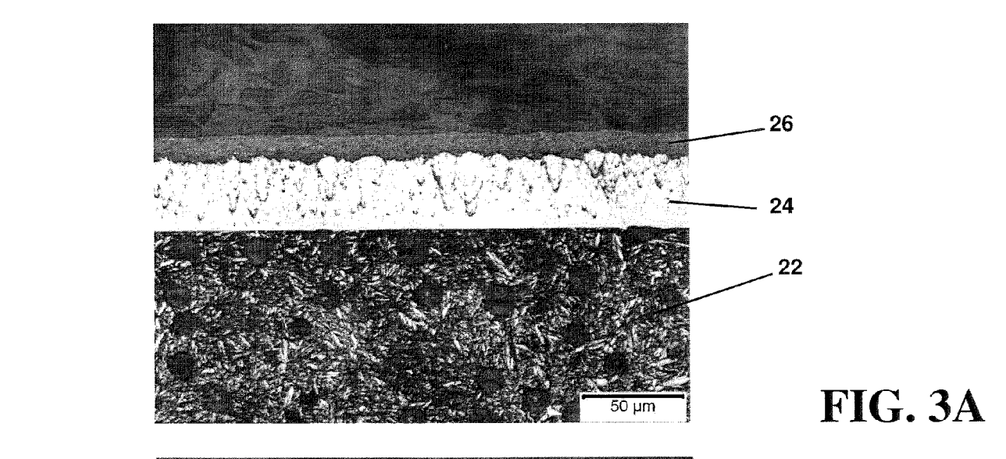
Figure 3B:
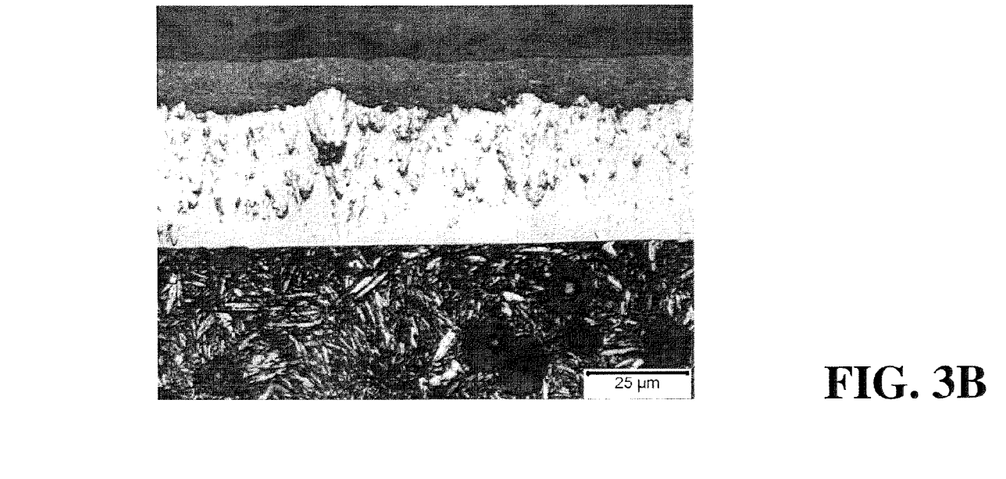
Figure 4A:
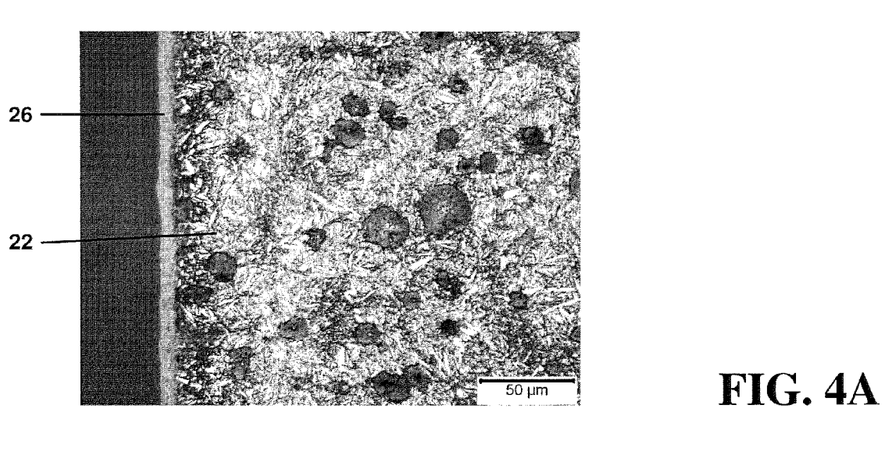
Figure 4B:
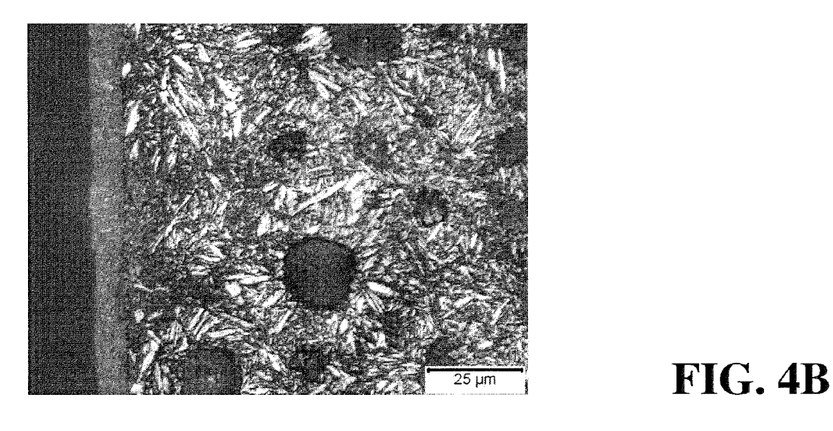

The thickness of the sliding coating 26 is less than the thickness of the base coating 24. In the exemplary embodiments, the thickness of the sliding coating 26 is only 2% to 60% of the thickness of the base coating 24. More typically, the thickness of the sliding coating 26 is 10% to 50% of the thickness of the base coating 24, or 25% to 45% of the thickness of the base coating 24. For example, the sliding coating 26 could have a thickness in the range of 5 μm to 25 μm, and the base coating 24 could have a thickness in the range of 20 μm to 60 μm. However, the thicknesses of each coating 24, 26 and thus the thickness ratio can be adjusted depending on the particular application of the sliding element 20 or other factors. FIGS. 3A and 3B are optical microscope images of the sliding coating 26 applied to the base coating 24 of the sliding element 20, specifically the running surface 28 of a piston ring, at two different magnifications, wherein the thickness of the sliding coating 26 is about 41% of the thickness of the base coating 24. In this example, the sliding coating 26 has a thickness of 13 μm and the base coating 24 has a thickness of 32 μm. FIGS. 4A and 4B are optical microscope images of the sliding coating 26 applied to the sliding element 20, specifically the side surface 32 of a piston ring, without a base coating 24, at two different magnifications, wherein the thickness of the sliding coating 26 is about 9 μm.

The sliding coating 26 is typically applied to the same surfaces of the substrate 22 as the base coating 24. However, the sliding coating 26 could be applied to another surface of the substrate 22 which does not include the base coating 24, or there could be surfaces of the substrate 22 which only include the base coating 24. In the exemplary embodiment, wherein the substrate 22 is a piston ring, the base coating 24 and the sliding coating 26 are both applied to the running surface 28 and the side surfaces 32.

The sliding coating 26 has a matrix formed of at least one polymer. Various types of resins and plastics can be used to form the polymer matrix, including cross-linkable bonding agents, thermoplastics, and duroplastics. For example, the polymer matrix can include at least one of polyamideimide (PAT), polyimide (PI), epoxy resin, polyben-zimidazole (PBI), silicone resin, unsaturated polyester resins, silicones, polyacrylates, polyetheretherketone (PEEK), and polyether sulfone (PES). Other high-melting thermoplastic materials having a melting point above 230° C. can also be used. In the exemplary embodiment, the polymer matrix consists of polyamideimide (PAI) and is present in an amount of at least 40.0 vol. %, based on the total volume of the sliding coating 26.

The sliding coating 26 also includes hard particles disposed throughout the matrix. The hard particles are typically present in an amount of 0.1 to 20.0 vol. %, based on the total volume of the sliding coating 26. The hard particles also preferably have a hardness of at least 600 HV/0.5 and a particle size of 0.01 to 5.0 μm. In the exemplary embodiment, the hard particles include $Fe_2O_3$ in an amount of 0.1 to 15.0 vol. %, and other particles different from $Fe_2O_3$ in an amount of 3.0 to 5.0 vol. %, based on the total volume of the sliding coating 26. The other particles are selected from the group consisting of nitrides, carbides, borides, oxides, and metal. Examples of the other hard particles include SiC, $Si_3N_4$, $B_4C_3$, cubic BN, $TiO_2$, or $SiO_2$; and metal powder made of Ag, Pb, Au, SnBi and/or Cu.

The sliding coating 26 also typically includes a solid lubricant in an amount of 5.0 to 30.0 vol. %, based on the total volume of the sliding coating 26. The solid lubricant includes at least one of $MoS_2$, graphite, $WS_2$, hexagonal boron nitride (h-BN), PTFE, and metal sulfide.

Another aspect of the invention provides a method of forming the sliding element 20. The method includes applying the base coating 24 to the substrate 22, and applying the sliding coating 26 to the base coating 24. The step of applying the base coating 24 to the substrate 22 includes a process selected from the group consisting of: physical vapor deposition (PVD), chemical vapor deposition (CVD), galvanic deposition, electrodeposition, electrochemical deposition, and a thermal spray process. The step of applying the base coating 24 also includes applying the base coating 24 to the surfaces of the substrate 22 until the base coating 24 has a thickness of not greater than 300 μm, but typically not greater than 50 μm. The step of applying the sliding coating 26 includes applying the sliding coating 26 to the base coating 24 when the base coating 24 is in the as-applied condition and has a surface roughness of at least 4.0 μm. The step of applying the sliding coating 26 also includes applying the sliding coating 26 until the sliding coating 26 has a thickness of not greater than 50 μm.

The combination of the base coating 24 and sliding coating 26 together improves performance of the sliding element 20, and also reduces overall manufacturing costs and time. In the exemplary embodiment, wherein the sliding coating 26 and base coating 24 are applied to the running surface 28 of the piston ring, the sliding coating 26 acts as a sacrificial run-in layer and could improve the scuff resistance of the base coating 24. As the sliding coating 26 runs against, or slides along, the cylinder bore of the engine (not shown), the polymer matrix of the sliding coating 26 wears down and the hard particles polish or reduce the surface roughness of the base coating 24. Due to the lower thickness and composition of the sliding coating 26, the sliding coating 26 wears down much faster than the base coating 24. Typically, the sliding coating 26 remains on the sliding element 20 for less than 1% of the total life of the engine, whereas the base coating 24 is designed to remain on the sliding element 20 for the entire life of the engine.

During use of the coated sliding element 20 in the internal combustion engine, the sliding coating 26 rubs against a cylinder bore or another counterpart causing the polymer of the sliding coating 26 to wear down and causing the exposed hard particles to rub against the cylinder bore or another counterpart. As the polymer wears away, the base coating 24 is exposed to the hard particles rubbing against the cylinder bore and counterpart. The friction between the hard particles and the base coating 24 as the hard particles rub against the cylinder bore or counterpart polishes the base coating 24. Over time, the surface roughness of the base coating 24 is significantly reduced to an acceptable level by the hard particles rubbing against the cylinder bore or counterpart. Thus, a smooth base coating 24 can be achieved without separate polishing, lapping, or otherwise reducing the surface roughness of the base coating 24 before use of the sliding element 20 in the internal combustion engine. In addition, when the sliding coating 26 is applied to the side surfaces 32, the sliding coating 24 can delay wear of the base coating 24 and/or substrate 22 against a ring groove of the piston (not shown). Finally, the sliding coating 26, as applied to the outer diameter (OD) running surface 28 and the side surfaces 32 would provide an initial sealing mechanism to contain the working gas above the piston, and maintain improved sealing as the components develop more intimate bearing contact.

EXPERIMENT

An experiment was conducted to compare the coefficient of friction of the sliding element 20 of the present invention to a comparative sliding element. The two sliding elements included identical substrates, each consisting of a KV4 cast iron material and provided in the form of a piston ring (Φ 107 mm). The substrates included an inside surface and oppositely facing running surface extending circumferentially about a center axis. A base coating 24 consisting of as deposited chromium and nitrogen (CrN) was applied to the running surface of both substrates by physical vapor deposition (PVD). The sliding coating 26 including the PAI matrix and hard particles of $Fe_2O_3$ was then applied to the base coating 24 of the inventive sliding element 20, but was not applied to not the comparative sliding element.

The sliding elements were then subjected to the Cameron & Plint test protocol. The coated running face of the sliding elements ran against a cylinder liner formed of compacted graphite iron (Φ 118 mm). During the test, the sliding elements were subjected to a load ($F_N$) of 400 N, a temperature of 190° C., frequency of 10 Hz, stroke v=13.5 mm, and 5W30 lubricating oil. The load was applied to the sliding elements for a duration of 4 hours.

Figure 5:
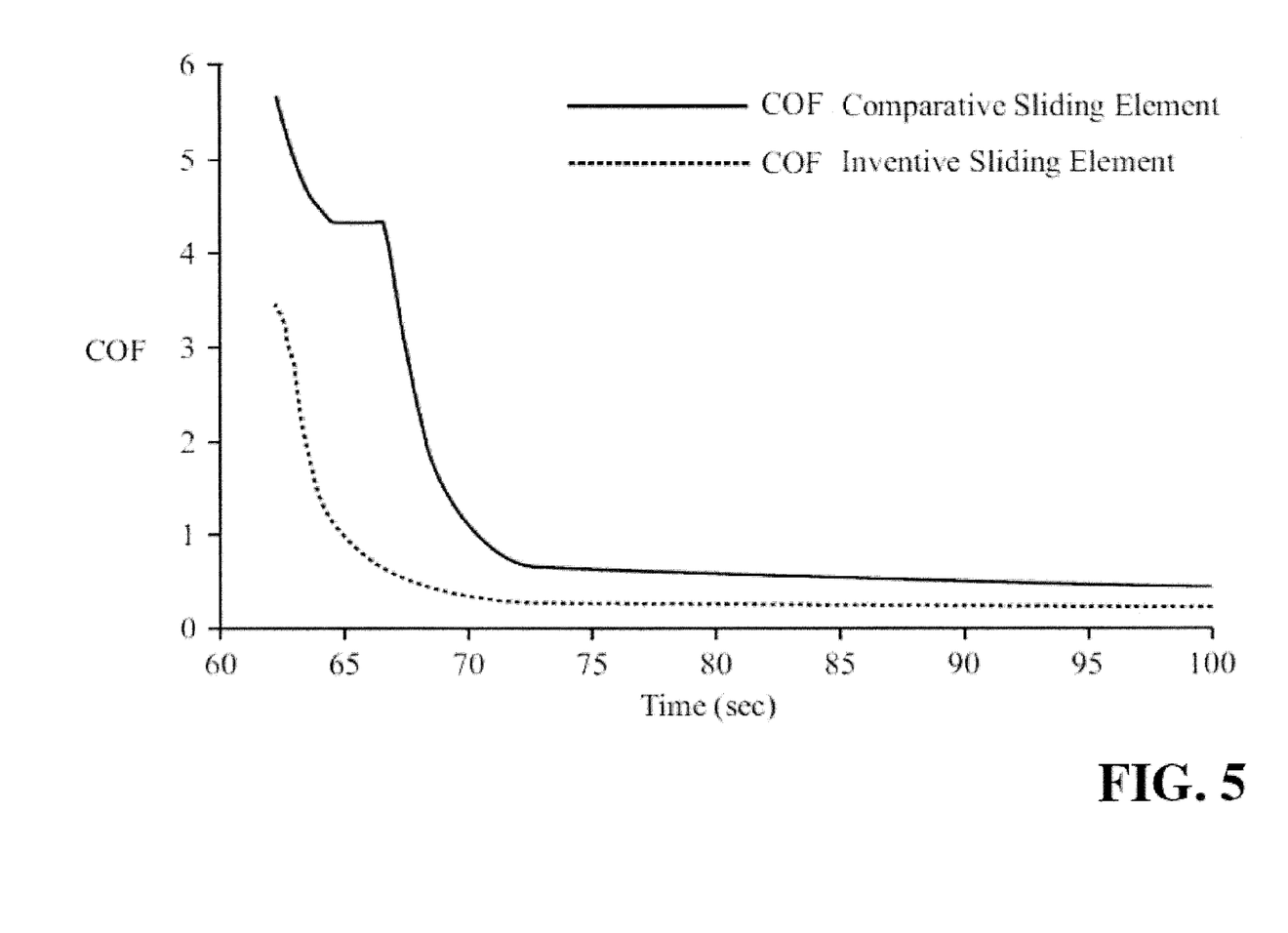
FIG. 5 is a graph illustrating results of an experiment comparing the coefficient of friction of an inventive example sliding element to a comparative sliding element.

FIG. 5 is a chart illustrating the results of the Cameron & Plint test, which includes the friction coefficient provided by the coated running surface of the inventive sliding element 20 compared to the friction coefficient provided by the coated running surface of the comparative sliding element. The test results show that the inventive sliding element 20, including a combination of the base coating 24 and sliding coating 26, achieved a lower coefficient of friction throughout the entire test duration.

Figure 6A:
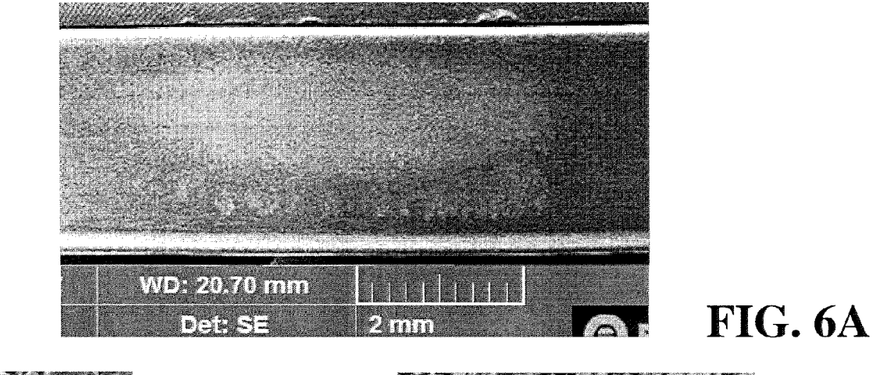
FIGS. 6A-6C are SEM images showing wear scar along the inventive example sliding element after the experiment.
Figure 6B:
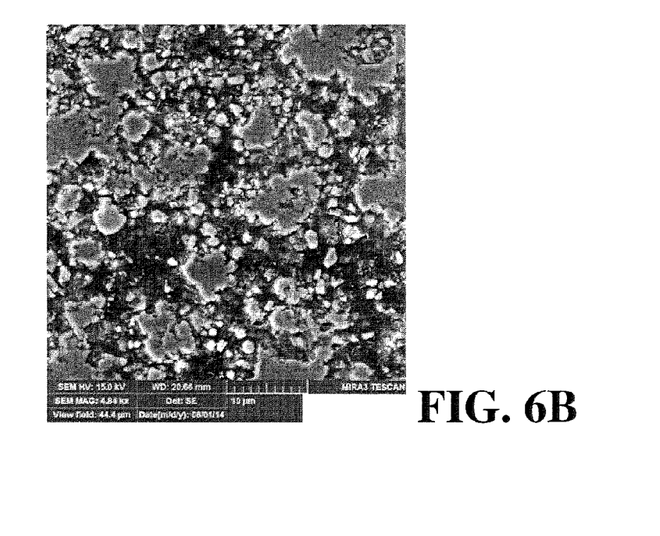
Figure 6C:
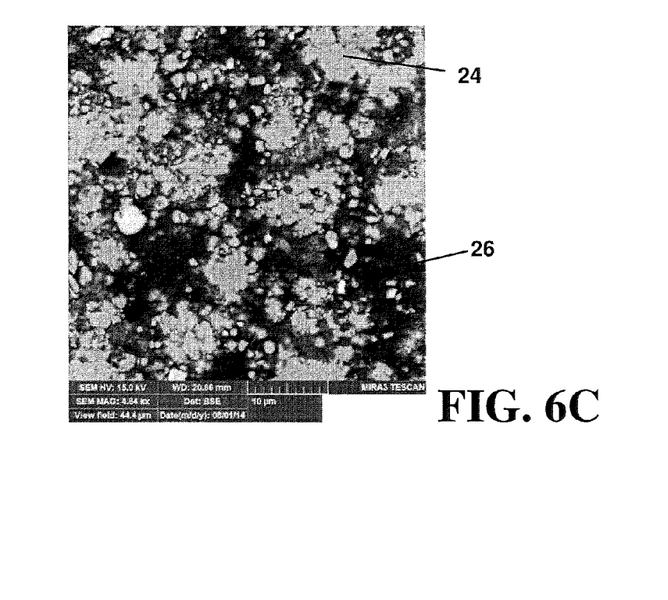

FIGS. 6A-6C are SEM images showing the wear scar along the coated running surface of the inventive sliding element 20 after the Cameron & Plint test. During the test, as the sliding coating 26 wore down, the hard particles of the sliding coating 26 began rubbing against the cylinder liner and polished the surface of the base coating 24. FIG. 6C is greatly magnified to clearly show the partially worn coatings 24, 26 after the Cameron & Hint test.

Obviously, many modifications and variations of the present invention are possible in light of the above teachings and may be practiced otherwise than as specifically described while within the scope of the appended claims.

What is claimed is:

1. A sliding element, comprising:
a substrate;
a base coating applied to said substrate, said base coating having a thickness and a surface roughness ($R_z$) of at least 4.0 μm;
a sliding coating applied to said base coating,
said sliding coating including a matrix consisting of polyamideimide, said matrix is present in an amount of at least 40.0 vol. %, based on the total volume of said sliding coating,
said sliding coating including hard particles disposed in said matrix, said hard particles are present in an amount of 0.1 to 20.0 vol. %, based on the total volume of said sliding coating,
said hard particles including $Fe_2O_3$ in an amount of 0.1 to 15.0 vol. %, based on the total volume of said sliding coating, said hard particles including other particles different from Fe$_2$O$_3$ in an amount of 3.0 to 5.0 vol. %, based on the total volume of said sliding coating, said other particles are selected from the group consisting of nitrides, carbides, borides, oxides, and metal, said hard particles have a hardness of at least 600 HV/0.5 and a particle size of 0.01 to 5.0 µm, said sliding coating including a lubricant in an amount of 5.0 to 30.0 vol. %, based on the total volume of said sliding coating, said solid lubricant includes at least one of MoS$_2$, graphite, WS$_2$ hexagonal boron nitride (h-BN), PTFE, and metal sulfide, and said sliding coating having a thickness of 2% to 60% of the thickness of said base coating.

2. The sliding element of claim 1, wherein said base coating has a surface roughness (R$_z$) of 5.0 µm to 8.0 µm and a surface roughness (R$_a$) of 0.6 µm to 0.8 µm.

3. The sliding element of claim 1, wherein said base coating has a composition selected from at least one of: chromium (Cr), chromium nitride (CrN), chromium carbide (CrC), chromium oxy nitride (CrON), titanium nitride (TiN), zirconium nitride (ZrN), aluminum titanium nitride (AlTiN), chromium and aluminum oxide, chromium and a ceramic, chromium and diamond, diamond, and diamond like carbon (DLC).

4. The sliding element of claim 1, wherein said sliding element is a piston ring and presents an inside surface facing toward and extending circumferentially around a center axis, a running surface facing opposite said inside surface, and a pair of side surfaces each interconnecting said inside surface and said running surface; and said base coating is applied to said running surface.

5. The sliding element of claim 1, wherein said base coating is applied to at least one of said side surfaces.

6. The sliding element of claim 1, wherein said substrate is a piston ring formed of an iron-based material and presents an inside surface facing toward and extending circumferentially around a center axis, a running surface facing opposite said inside surface, and a pair of side surfaces each interconnecting said inside surface and said running surface;

said base coating is applied to said running surface and at least one of said side surfaces;

said base coating has a surface roughness (R$_z$) of 5.0 µm to 8.0 µm and a surface roughness (R$_a$) of 0.6 µm to 0.8 µm;

said base coating is in an as-applied condition and is not polished or lapped;

said base coating has a thickness of not greater than 300 µm;

said base coating has a composition selected from at least one of: chromium (Cr), chromium nitride (CrN), chromium carbide (CrC), chromium oxy nitride (CrON), titanium nitride (TiN), zirconium nitride (ZrN), aluminum titanium nitride (AlTiN), chromium and aluminum oxide, chromium and a ceramic, chromium and diamond, diamond, and diamond like carbon (DLC);

said base coating is applied by a process selected from the group consisting of: physical vapor deposition, chemical vapor deposition, galvanic deposition, electrodeposition, electrochemical deposition, and a thermal spray process;

said sliding coating has a thickness of 10% to 50% of the thickness of said base coating;

said sliding coating has thickness of not greater than 50 µm; and wherein said sliding coating remains on said sliding element for less than 1% of the total life of an internal combustion engine and said base coating remains on said sliding element for the entire life of the internal combustion engine when said sliding element is used in the internal combustion engine.

7. A method of forming a sliding element, comprising the steps of:

applying a base coating to a substrate, the base coating having a thickness and a surface roughness (R$_z$) of at least 4.0 µm; and applying a sliding coating to the base coating, the sliding coating including a matrix consisting of polyamideimide and is present in an amount of at least 40.0 vol. %, based on the total volume of the sliding coating, the sliding coating including hard particles disposed in the matrix, the hard particles are present in an amount of 0.1 to 20.0 vol. %, based on the total volume of the sliding coating, the hard particles are formed of at least one of nitrides, carbides, borides, oxides, and metal, the hard particles including Fe$_2$O$_3$ in an amount of 0.1 to 15.0 vol. % and other particles different from Fe$_2$O$_3$ in an amount of 3.0 to 5.0 vol. % based on the total volume of the sliding coating, the other particles are selected from the group consisting of nitrides, carbides, borides, oxides, and metal, the hard particles having a hardness of at least 600 HV/0.5 and a particle size of 0.01 to 5.0 µm, the sliding coating including solid lubricant in an amount of 5.0 to 30.0 vol. %, based on the total volume of the sliding coating, and the solid lubricant includes at least one of MoS$_2$, graphite, WS$_2$ hexagonal boron nitride (h-BN), PTFE, and metal sulfide, and the sliding coating having a thickness of 2% to 60% of the thickness of the base coating.

8. The method of claim 7, wherein the base coating has a surface roughness (R$_z$) of 5.0 µm to 8.0 µm and a surface roughness (R$_a$) of 0.6 µm to 0.8 µm.

9. The method of claim 7, wherein the step of applying the sliding coating includes applying the sliding coating to the base coating when the base coating is in the as-applied condition and has a surface roughness of at least 4.0 µm.

10. The method of claim 7, wherein the step of applying the base coating to the substrate includes a process selected from the group consisting of: physical vapor deposition, chemical vapor deposition, galvanic deposition, electrodeposition, electrochemical deposition, and a thermal spray process.

11. The method of claim 10, wherein the base coating has a composition selected from at least one of: chromium (Cr), chromium nitride (CrN), chromium carbide (CrC), chromium oxy nitride (CrON), titanium nitride (TiN), zirconium nitride (ZrN), aluminum titanium nitride (AlTiN), chromium and aluminum oxide, chromium and a ceramic, chromium and diamond, diamond, and diamond like carbon (DLC).

12. The method of claim 11, wherein the composition of the base coating consists of chromium, chromium and aluminum oxide, or chromium and diamond; and the step of applying the base coating includes galvanic deposition.

13. A method of forming a sliding element, comprising the steps of:

applying a base coating to a substrate, the base coating having a thickness and a surface roughness (R$_z$) of at least 4.0 µm;

applying a sliding coating to the base coating, the sliding coating including a matrix formed of least one polymer, the sliding coating including hard particles disposed in the matrix, the hard particles being formed of at least one of nitrides, carbides, borides, oxides, and metal, and the sliding coating having a thickness of 2% to 60% of the thickness of the base coating, wherein the composition of the base coating consists of chromium and nitrogen; and the step of applying the base coating includes physical vapor deposition.

14. A method of forming a sliding element, comprising the steps of:

applying a base coating to a substrate, the base coating having a thickness and a surface roughness ($R_z$) of at least 4.0 μm;

applying a sliding coating to the base coating, the sliding coating including a matrix formed of least one polymer, the sliding coating including hard particles disposed in the matrix, the hard particles being formed of at least one of nitrides, carbides, borides, oxides, and metal, and the sliding coating having a thickness of 2% to 60% of the thickness of the base coating, wherein the composition of the base coating consists of diamond like carbon (DLC); and the step of applying the base coating includes physical vapor deposition, chemical vapor deposition, or plasma-assisted chemical vapor deposition (PA-CVD).

15. A method of forming a sliding element, comprising the steps of:

applying a base coating to a substrate, the base coating having a thickness and a surface roughness ($R_z$) of at least 4.0 μm;

applying a sliding coating to the base coating, the sliding coating including a matrix formed of least one polymer, the sliding coating including hard particles disposed in the matrix, the hard particles being formed of at least one of nitrides, carbides, borides, oxides, and metal, and the sliding coating having a thickness of 2% to 60% of the thickness of the base coating, wherein the composition of the base coating consists of chromium and nitrogen; and the step of applying the base coating includes physical vapor deposition.

16. The method of claim 7, wherein the sliding element is a piston ring and presents an inside surface facing toward and extending circumferentially around a center axis, a running surface facing opposite the inside surface, and a pair of side surfaces each interconnecting the inside surface and the running surface; and the base coating is applied to the running surface.

17. The method of claim 7, including providing the substrate, wherein the substrate is a piston ring formed of an iron-based material and presents an inside surface facing toward and extending circumferentially around a center axis, a running surface facing opposite the inside surface, and a pair of side surfaces each interconnecting the inside surface and the running surface;

wherein the base coating has a surface roughness ($R_z$) of 5.0 μm to 8.0 μm and a surface roughness ($R_a$) of 0.6 μm to 0.8 μm, the base coating remains in an as-applied condition and is not polished or lapped; the base coating has a composition selected from at least one of: chromium (Cr), chromium nitride (CrN), chromium carbide (CrC), chromium oxy nitride (CrON), titanium nitride (TiN), zirconium nitride (ZrN), aluminum titanium nitride (AlTiN), chromium and aluminum oxide, chromium and a ceramic, chromium and diamond, diamond, and diamond like carbon (DLC);

the step of applying the base coating includes applying the base coating to the running surface and at least one of the side surfaces;

the step of applying the base coating to the substrate includes a process selected from the group consisting of: physical vapor deposition, chemical vapor deposition, galvanic deposition, electrodeposition, electrochemical deposition, and a thermal spray process;

the step of applying the base coating includes applying the base coating to the surfaces of the substrate until the base coating has a thickness of not greater than 300 μm;

the step of applying the sliding coating includes applying the sliding coating to the base coating when the base coating is in the as-applied condition and has a surface roughness of at least 4.0 μm; and the step of applying the sliding coating includes applying the sliding coating until the sliding coating has a thickness of not greater than 50 μm; and the step of applying the sliding coating includes applying the sliding coating to a thickness of 10% to 50% of the thickness of the base coating.

* * * * *